United States Patent [19]
Ueda et al.

[11] Patent Number: 5,707,687
[45] Date of Patent: Jan. 13, 1998

[54] ROTARY-CUP COATING APPARATUS AND METHOD OF COATING OBJECT WITH SUCH ROTARY-CUP COATING APPARATUS

[75] Inventors: Koji Ueda; Hiroki Endo; Hidenori Miyamoto, all of Kanagawa, Japan

[73] Assignee: Tokyo Ohka Kogyo Co., Ltd., Kanagawa, Japan

[21] Appl. No.: 637,357

[22] Filed: Apr. 24, 1996

[30] Foreign Application Priority Data

Apr. 24, 1995 [JP] Japan .................... 7-098166

[51] Int. Cl.[6] ...................... B05D 3/12; B05D 1/18; B05C 11/02

[52] U.S. Cl. ............ 427/240; 427/430.1; 118/50; 118/52; 118/326

[58] Field of Search ............... 427/240, 430.1; 118/50, 52, 326

[56] References Cited

U.S. PATENT DOCUMENTS 5,439,519  8/1995  Sago et al. .................... 118/52

FOREIGN PATENT DOCUMENTS 3293055  12/1991  Japan .

*Primary Examiner*—Shrive Beck
*Assistant Examiner*—Bret Chen
*Attorney, Agent, or Firm*—Weiner, Carrier, Burt & Esser, P.C.; Joseph P. Carrier; Irving M. Weiner

[57] ABSTRACT

A suction chuck and an inner cup are rotated in unison with each other to spread a coating solution uniformly over a planar object in the inner cup under centrifugal forces. Vent holes defined in an outer cup lid which closes an outer cup are held out of communication with vent holes defined in a ring-shaped closure member, so that the interior space in the outer cup is kept out of communication with the exterior space around the outer cup. The concentration of a solvent in the outer cup remains so high that no mist is produced in the outer cup. After the planar object has been coated and before the outer cup lid is opened, the ring-shaped closure member is turned to align the vent holes in the outer cup lid with the vent holes in the ring-shaped closure member, breaking any vacuum in the outer cup with ambient air introduced through the vent holes into the outer cup. Thereafter, the outer and inner cup lids are opened, and the coated planar object is taken out.

17 Claims, 2 Drawing Sheets

ROTARY-CUP COATING APPARATUS AND METHOD OF COATING OBJECT WITH SUCH ROTARY-CUP COATING APPARATUS

BACKGROUND OF THE INVENTION

1. Field of the Invention

The present invention relates to a rotary-cup coating apparatus for coating a planar object such as a glass substrate, a semiconductor wafer, or the like with a coating solution such as a resist solution, an SOG (Spin-On-Glass) solution of a silicon compound dissolved in an organic solvent, or a film of silicon oxide formed when such an SOG solution is coated and fired, and a method of coating a planar object using such a rotary-cup coating apparatus.

2. Description of the Related Art

One known rotary-cup coating apparatus comprises an outer cup, an inner cup disposed in the outer cup, and a chuck positioned in the inner cup. When a object to be coated is attracted by the chuck, a coating solution such as an SOG solution is dropped onto the object, and the inner cup is rotated to rotate the object for spreading the dropped coating solution uniformly over the surface of the object under centrifugal forces. Such a known rotary-cup coating apparatus is disclosed in Japanese laid-open patent publication No. 3-293055.

During operation of the disclosed rotary-cup coating apparatus, the coating solution is spread over the surface of the object while upper openings of the inner and outer cups are being closed by respective dedicated lids.

Specifically, if the coating solution is spread over the surface of the object while the upper opening of the outer cup is not closed, the concentration of the solvent in a casing which makes up the outer cup is lowered, generating a mist which tends to be attached to the surface of the object, resulting in a reduced throughput of the rotary-cup coating apparatus. To avoid such a problem, the upper openings of both the inner and outer cups are closed while the coating solution is being spread over the surface of the object.

However, the closed upper opening of the outer cup poses a certain problem after the object has fully been coated with the coating solution. Specifically, since the outer cup has been evacuated by the rotation of the inner cup during the coating process, when the lid is opened to open the outer cup after the object has fully been coated with the coating solution, dust particles floating in ambient air flow into the outer cup, possibly forming pits on the surface of the object.

Attempts have been made to eliminate the above drawback by forming a small vent hole in the lid for the outer cup. However, if the vent hole is large enough to break the vacuum in the outer cup, then the concentration of the solvent in the outer cup is reduced, producing a mist.

Therefore, the conventional rotary-cup coating apparatus fails to satisfy both requirements of preventing a mist from being generated in the outer cup during the coating process and preventing dust particles from being introduced into the outer cup when the lid is opened to open the outer cup after the coating solution has been coated on the object. Stated otherwise, one of the requirements has been sacrificed for the other with the conventional rotary-cup coating apparatus.

SUMMARY OF THE INVENTION

It is therefore an object of the present invention to provide a rotary-cup coating apparatus for coating an object while preventing a mist from being generated in an outer cup and also preventing dust particles from flowing into the outer cup when an outer cup lid is opened.

Another object of the present invention is to provide a method of coating an object with such a rotary-cup coating apparatus.

According to the present invention, there is provided a rotary-cup coating apparatus for coating an object, comprising an outer cup, an inner cup rotatably disposed in the outer cup, for placing an object to be coated therein, an outer cup lid for closing the outer cup, the outer cup lid having at least one vent hole defined therein and providing communication between an interior space in the outer cup and an exterior space around the outer cup, an inner cup lid for closing the inner cup, and a closure member movably mounted on the outer cup lid for selectively opening and closing the vent hole. The outer cup lid may have a circular array of first vent holes defined therein at equal intervals coaxially with the outer cup lid, and the closure member may comprise a ring-shaped closure member having a circular array of second vent holes defined therein at equal intervals for selective communication with the first vent holes, respectively thereby to open the first vent holes.

According to the present invention, there is also provided a method of coating an object with a rotary-cup coating apparatus having an outer cup, an inner cup rotatably disposed in the outer cup, for placing the object to be coated therein, an outer cup lid for closing the outer cup, the outer cup lid having at least one vent hole defined therein for providing communication between an interior space in the outer cup and an exterior space around the outer cup, an inner cup lid for closing the inner cup, and a closure member movably mounted on the outer cup lid for selectively opening and closing the vent hole, the method comprising the steps of closing the outer and inner cups respectively with the outer and inner cup lids and closing the vent hole with the closure member, rotating the inner cup to coat the object placed therein, and after the object is coated and before the outer cup lid is opened, opening the vent hole with the closure member thereby to provide communication between the interior space in the outer cup and the exterior space around the outer cup.

According to the present invention, there is further provided a method of coating an object with a rotary-cup coating apparatus having an outer cup, an inner cup rotatably disposed in the outer cup, for placing the object to be coated therein, an outer cup lid for closing the outer cup, the outer cup lid having a circular array of first vent holes defined therein at equal intervals coaxially with the outer cup lid, for providing communication between an interior space in the outer cup and an exterior space around the outer cup, an inner cup lid for closing the inner cup, and a ring-shaped closure member movably mounted on the outer cup lid for selectively opening and closing the first vent holes, the ring-shaped closure member having a circular array of second vent holes defined therein at equal intervals for selective communication with the first vent holes, respectively, to open the first vent holes, the method comprising the steps of closing the outer and inner cups respectively with the outer and inner cup lids and closing the first vent holes with the closure member, rotating the inner cup to coat the object placed therein, and after the object is coated and before the outer cup lid is opened, bringing the second vent holes into communication with the first vent holes thereby to open the first vent holes thereby to provide communication between the interior space in the outer cup and the exterior space around the outer cup.

With the above arrangement, while the coating solution is being coated on the object which is being rotated, the upper openings of the outer and inner cups are closed by the outer and inner cup lids, respectively, and the first vent holes in the outer cup lid are closed by the ring-shaped closure member. After the coating solution is coated on the object and before the outer cup lid is opened, the ring-shaped closure member is turned to bring the second vent holes thereof into communication with the first vent holes, thereby providing communication between the interior space in the outer cup and the exterior space around the outer cup.

While the object is being coated, a mist is prevented from being generated in the outer cup because the first vent holes are closed. When the outer cup lid is opened, dust particles are prevented from flowing into the outer cup because any vacuum developed in the outer cup in the coating process has already been broken.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
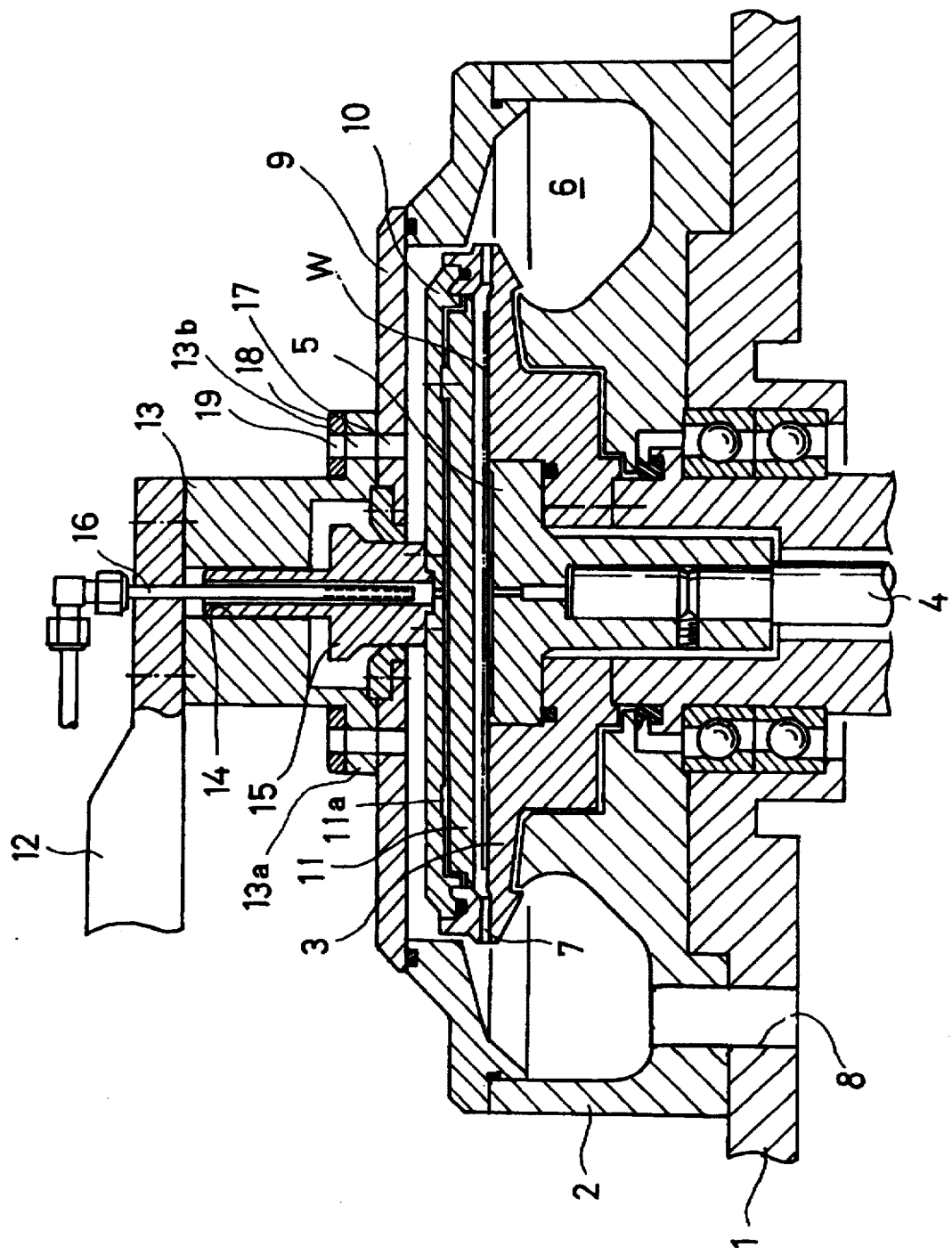
FIG. 1 is a vertical cross-sectional view of a rotary-cup coating apparatus according to the present invention.
Figure 2:
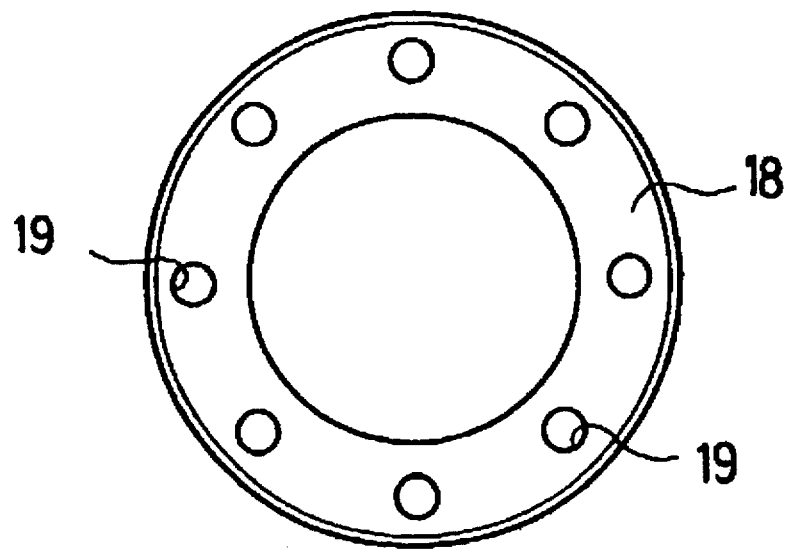
FIG. 2 is a plan view of a ring-shaped closure member of the rotary-cup coating apparatus shown in FIG. 1.

As shown in FIG. 1, a rotary-cup coating apparatus according to the present invention comprises a base 1, an outer cup 2 fixedly mounted on the base 1, an inner cup 3 disposed in the outer cup 2, and a spinner shaft 4 extending vertically centrally through the base 1 and the inner cup 3 and secured to the inner cup 3 for rotating the inner cup 3 in unison with the spinner shaft 4. The spinner shaft 4 is connected to a motor (not shown) which, when energized, rotates the spinner shaft 4. A suction chuck 5 is mounted on an upper end of the spinner shaft 4 for securely attracting a planar object W such as a glass substrate, a semiconductor wafer, or the like under suction to an upper surface of the inner cup 3.

The inner cup 3 may be rotated in unison with the spinner shaft 4 by transmitting rotational forces from the spinner shaft 4 to the inner cup 3 or vice versa. In view of the size of the object W, it is preferable to transmit rotational forces from the spinner shaft 4 to the inner cup 3 to rotate the inner cup 3 with the spinner shaft 4 because no undue loads are imposed on the inner cup 3.

The outer cup 2 has an annular drain passage 6 defined therein around the inner cup 3, and the inner cup 3 has drain holes 7 defined in an outer wall thereof and opening radially outwardly into the annular drain passage 6. The outer cup 2 and the base 1 have a drain hole 8 defined vertically therein and connected to the annular drain passage 6.

Outer and inner cup lids 9, 10 are mounted on respectively on the outer and inner cups 2, 3 for closing respective upper openings in the outer and inner cups 2, 3. A flow rectifying plate 11 is attached to a lower surface of the inner cup lid 10. A gap or clearance 11a is defined between the flow rectifying plate 11 and the lower surface of the inner cup lid 10 for allowing a cleaning solution or a diluted gas to flow therethrough.

The outer cup lid 9 is supported by a support block 13 on a lower surface of an arm 12 which is linearly, angularly, and/or vertically movable. The support block 13 has a vertical through hole 14 defined therein which accommodates therein a hollow shaft 15 extending downwardly beyond and aligned coaxially with the outer cup lid 9. The inner cup lid 10 is centrally attached to a lower end of the hollow shaft 15. A vertical pipe 16 for supplying a cleaning solution or a diluted gas therethrough is inserted in the hollow shaft 15. The hollow shaft 15 includes a larger-diameter low end portion which is vertically movable with respect to, but engageable with, the outer cup lid 9. When the inner cup lid 10 moves downwardly away from the outer cup lid 9, the larger-diameter low end portion of the hollow shaft 15 engages the outer cup lid 9 thereby to prevent the inner cup lid 10 from falling off. When the inner cup lid 10 is forcibly moved upwardly under undue external forces, the movable larger-diameter low end portion of the hollow shaft 15 allows the inner cup lid 10 to ascend relatively to the outer cup lid 9.

The outer cup lid 9 has a circular array of vertical through vent holes 17 defined therein around the hollow shaft 15 and providing communication between the interior space in the outer cup 2 and the exterior space around the outer cup 2. The vent holes 17 are spaced at equal intervals around the central axis of the outer cup lid 9.

The support block 13 has an annular flange 13a projecting radially outwardly from the lower end thereof and mounted on the upper surface of the outer cup lid 9. The annular flange 13a has a circular array of vertical through vent holes 13b defined therein at equal intervals in communication with the respective vent holes 17. A ring-shaped closure member 18 is rotatably fitted over the support block 13 and slidably supported on the upper surface of the annular flange 13a. The ring-shaped closure member 18 has a circular array of vertical through vent holes 19 defined therein at equal intervals.

For coating the upper surface of the object W with a coating solution, the upper openings of the outer and inner cups 2, 3 are opened, and the object W is placed in the inner cup 3 and securely held in position by the suction chuck 5. Then, the coating solution is dropped onto the upper surface of the object W. Thereafter, the upper openings of the outer and inner cups 2, 3 are closed by the respective outer and inner cup lids 9, 10 as shown in FIG. 1.

Figure 3:
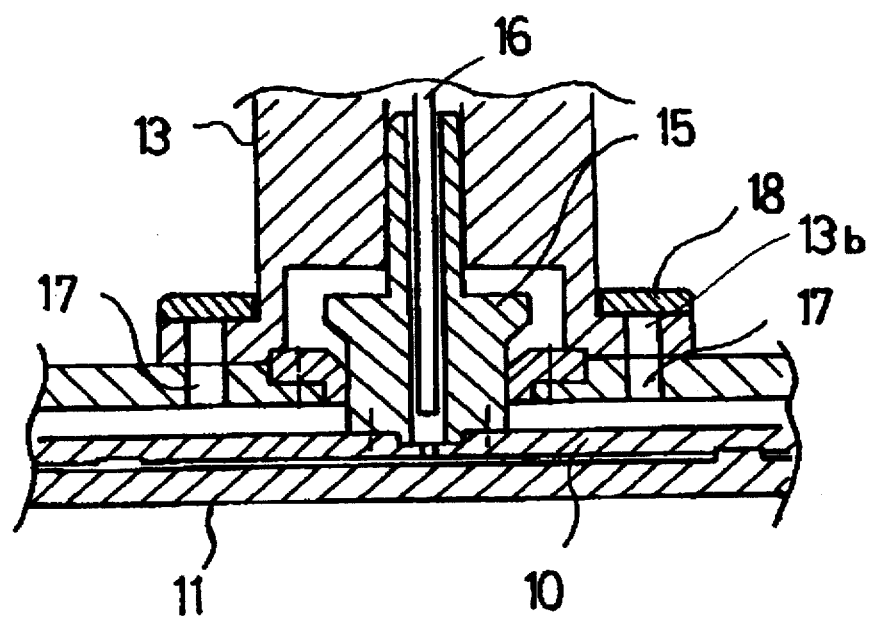
FIG. 3 is a fragmentary cross-sectional view of an outer cup which is closed by a lid whose vent holes are closed by the ring-shaped closure member shown in FIG. 2.

Thereafter, the motor is energized to rotate the spinner shaft 4, and hence the suction chuck 5 and the inner cup 3 in unison therewith, spreading the dropped coating solution uniformly over the upper surface of the object W under centrifugal forces. At this time, as shown in FIG. 3 the ring-shaped closure member 18 is angularly positioned to close the vent holes 13b, 17, i.e., to keep the vent holes 19 fully out of communication with the vent holes 13b, 17. Therefore, the concentration of the solvent in the outer cup 2 is high enough to prevent a mist from being generated in the outer cup 2.

After the coating solution has been fully spread and coated on the upper surface of the object W, the ring-shaped closure member 18 is rotated to bring the vent holes 19 into communication with the vent holes 13b, 17 before the outer cup lid 9 is opened, as shown in FIG. 1. Now, ambient air is introduced through the vent holes 19, 13b, 17 into the outer cup 2, breaking the vacuum in the outer cup 2. Then, the outer and inner cup lids 9, 10 are opened, and the coated object W is taken out of the inner cup 3, and carried to a next process such as an evacuating drying process. Since no vacuum is present in the outer cup 2 immediately before the outer and inner cup lids 9, 10 are opened, no dust particles flow into the outer cup 2 when it is opened.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A rotary-cup coating apparatus for coating an object, comprising:

an outer cup;

an inner cup rotatably disposed in said outer cup, for placing an object to be coated therein;

an outer cup lid for closing said outer cup, said outer cup lid having at least one vent hole defined therein and providing communication between an interior space in said outer cup surrounding said inner cup and an exterior space around said outer cup;

an inner cup lid for closing said inner cup; and a closure member movably mounted on said outer cup lid for selectively opening and closing said vent hole.

2. A rotary-cup apparatus according to claim 1, wherein said outer cup lid has a circular array of first vent holes defined therein at equal intervals, said array is arranged coaxially with said outer cup lid, and said closure member comprises a ring-shaped closure member having a circular array of second vent holes defined therein at equal intervals for selectively communicating with said first vent holes, respectively, thereby to open said first vent holes.

3. A rotary-cup coating apparatus according to claim 1, wherein said inner cup lid remains fully closed over said inner cup while said closure member opens said vent hole.

4. A rotary-cup coating apparatus according to claim 1, wherein said closure member is rotatable relative to said outer lid.

5. A rotary-cup coating apparatus for coating an object, comprising:

an outer cup;

an inner cup rotatably disposed in said outer cup, for placing an object to be coated therein;

a lid means for being placed over respective upper openings in said outer cup and said inner cup, for thereby closing said outer cup and said inner cup during a coating operation; and vent means operatively associated with said lid means for selectively providing communication between an interior space in said outer cup surrounding said inner cup and an exterior space around said outer cup while said lid means closes the upper openings of said outer cup and said inner cup.

6. A rotary-cup coating apparatus according to claim 5, wherein said lid means includes an outer cup lid for closing said outer cup and an inner cup lid for dosing said inner cup; and said vent means comprises at least one vent hole defined in said outer cup lid and a closure member movably mounted on said outer cup lid for selectively opening and closing said vent hole.

7. A rotary-cup coating apparatus according to claim 6, wherein said closure member is rotatable relative to said outer cup lid.

8. A rotary-cup coating apparatus according to claim 5, wherein said lid means comprises an outer cup lid for closing said outer cup and inner cup lid for closing said inner cup; and said vent means comprises a plurality of first vent holes defined in said outer cup lid, and closure means for simultaneously opening said vent holes and simultaneously closing said vent holes.

9. A rotary-cup coating apparatus according to claim 8, wherein said closure means comprises a closure member having a plurality of second vent holes defined therein, said closure member being moveable relative to said outer cup lid so as to selectively move said second vent holes into alignment with said first vent holes.

10. A rotary-cup coating apparatus according to claim 5, wherein said lid means remains fully closed over said inner cup while said vent means provides communication between the interior space in said outer cup surrounding said inner cup and the exterior space around said outer cup.

11. A rotary-cup coating apparatus according to claim 5, wherein said vent means is rotatable relative to said lid means.

12. A method of coating an object with a rotary-cup coating apparatus having an outer cup, an inner cup rotatably disposed in said outer cup, for placing the object to be coated therein, an outer cup lid for closing said outer cup, said outer cup lid having at least one vent hole defined therein for providing communication between an interior space in said outer cup surrounding said inner cup and an exterior space around said outer cup, an inner cup lid for closing said inner cup, and a closure member movably mounted on said outer cup lid for selectively opening and closing said vent hole, said method comprising the steps of:

closing the outer and inner cups respectively with the outer and inner cup lids and closing said vent hole with said closure member;

rotating said inner cup to coat an object placed therein; and after the object is coated and before the outer cup lid is opened, opening said vent hole with said closure member thereby to provide communication between the interior space in said outer cup and the exterior space around said outer cup.

13. A method of coating an object according to claim 12, wherein said outer cup lid has a circular array of first vent holes defined therein at equal intervals, said array is disposed coaxially with said outer cup lid, for providing said communication between the interior space in said outer cup and the exterior space around said outer cup, said closure member is a ring-shaped member movably mounted to said outer cup lid for selectively opening and closing said first vent holes, said ring-shaped closure member having a circular array of second vent holes defined therein at equal intervals for selective communication with said first vent holes, respectively, to open said first vent holes, said closing step involves closing said first vent holes with said closure member, and said vent hole opening step involves moving said closure member to bring said second vent holes into communication with said first vent holes thereby to open said first vent holes thereby to provide communication between the interior space in said outer cup and the exterior space around the inner cup.

14. A method according to claim 12, including the further step of:

opening the outer cup lid after the interior space in said outer cup has been vented in said vent hole opening step.

15. A method of coating an object according to claim 12, further including the steps of placing an object in the inner cup, and applying a quantity of coating solution onto a surface of the object prior to said closing step.

16. A method of coating an object according to claim 12, wherein said inner cup lid remains fully closed over said inner cup while said closure member opens said vent hole.

17. A method of coating an object according to claim 12, wherein said vent hole opening step involves rotating said closure member relative to said outer cup lid.

* * * * *

UNITED STATES PATENT AND TRADEMARK OFFICE
CERTIFICATE OF CORRECTION

PATENT NO. : 5,707,687
DATED : January 13, 1998
INVENTOR(S) : Koji Ueda, Hiroki Endo, Hidenori Miyamoto It is certified that error appears in the above-indentified patent and that said Letters Patent is hereby corrected as shown below:

Column 1, line 19, change "a object" to --an object--.
Column 3, line 60, delete "on".
Column 5, line numbered approximately 26, after "rotary-cup"
    insert --coating--;
        line 32, change "selectively
    communicating" to --selective communication--;
        line 59, change "dosing" to --closing--.
Column 6, line 4, change "and inner" to --and an inner--.

Signed and Sealed this

Fourteenth Day of April, 1998

Attest:

BRUCE LEHMAN

*Attesting Officer*        *Commissioner of Patents and Trademarks*